US010037794B1

(12) United States Patent
Janardan et al.

(10) Patent No.: US 10,037,794 B1
(45) Date of Patent: Jul. 31, 2018

(54) SRAM READ MULTIPLEXER INCLUDING REPLICA TRANSISTORS

(71) Applicant: STMicroelectronics International N.V., Schiphol (NL)

(72) Inventors: Dhori Kedar Janardan, Ghaziabad (IN); Abhishek Pathak, Nowgong (IN); Shishir Kumar, Greater Noida (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/660,371

(22) Filed: Jul. 26, 2017

(51) Int. Cl.
*G11C 5/06* (2006.01)
*G11C 11/417* (2006.01)

(52) U.S. Cl.
CPC ................... *G11C 11/417* (2013.01)

(58) Field of Classification Search
CPC .......................... G11C 11/417; G11C 11/1655
USPC .......................................................... 365/72
See application file for complete search history.

(56) References Cited

U.S. PATENT DOCUMENTS

| 5,633,828 | A | * | 5/1997 | McClure | ................ | G11C 29/04 |
| | | | | | | 365/190 |
| 5,969,995 | A | * | 10/1999 | Morishima | ........... | G11C 11/417 |
| | | | | | | 365/189.04 |
| 2006/0256605 | A1 | * | 11/2006 | Joshi | ..................... | G11C 11/417 |
| | | | | | | 365/100 |
| 2008/0279017 | A1 | * | 11/2008 | Shimano | ................ | G11C 5/063 |
| | | | | | | 365/189.06 |

* cited by examiner

Primary Examiner — Tha-O H Bui
(74) Attorney, Agent, or Firm — Crowe & Dunlevy

(57) ABSTRACT

A first transistor has a first conduction terminal coupled to a second bit line, a second conduction terminal coupled to a bit line node, and a control terminal biased by a second control signal. A second transistor has a first conduction terminal coupled to a second complementary bit line, a second conduction terminal coupled to a complementary bit line node, and a control terminal biased by the second control signal. A first replica transistor has a first conduction terminal coupled to the second bit line, a second conduction terminal coupled to the complementary bit line node, and a control terminal biased such that the first replica transistor is off. A second replica transistor has a first conduction terminal coupled to the second complementary bit line, a second conduction terminal coupled to the bit line node, and a control terminal biased such that the second replica transistor is off.

17 Claims, 5 Drawing Sheets

US 10,037,794 B1

SRAM READ MULTIPLEXER INCLUDING REPLICA TRANSISTORS

TECHNICAL FIELD

This application is directed to the field of static random access memory (SRAM) circuits, and in particular, to a SRAM circuit that utilizes replica transistors to compensate for currents injected into bit lines through parasitic capacitances.

BACKGROUND

A prior art SRAM memory circuit 50 is now described with reference to FIG. 1A. The SRAM memory circuit 50 includes first and second columns 52 and 54. The first column 52 includes memory cell 51 with a bitline BL0 and complementary bitline BLB0 associated therewith. The second column 54 includes memory cell 53 with bitline BL1 and complementary bitline BLB1 associated therewith. The column selection circuit 60 includes a PMOS transistor M1 with its source coupled to complementary bitline BLB0, its drain coupled to node INN, and its gate biased by control signal CTRL1. PMOS transistor M2 has its source coupled to bitline BL0, its drain coupled to node INP, and its gate biased by control signal CTRL1.

The column selection circuit 60 further includes a PMOS transistor M3 has its source coupled to complementary bitline BLB1, it drain coupled to node INN, and its gate biased by control signal CTRL2. PMOS transistor M4 has its source coupled to bitline BL1, its drain coupled to node INP, and its gate biased by control signal CTRL2.

Nodes INN and INP serve as the outputs of the column selection circuit 60 and the inputs to sense amplifier 55. In operation, one column 52 or 54 is selected by the column selection circuit 60 while the other column 52 or 54 is unselected. In the example operation state shown in FIG. 1A, column 52 is selected while column 54 is deselected. This is accomplished by control signal CTRL1 going low to turn on bitline select transistors M1 and M2, while control signal CTRL2 goes high or remains high to turn off bitline select transistors M3 and M4.

In an ideal case, as can be seen in FIG. 1B, when bitline BL0 and complementary bitline BLB0 are selected by transistors M1 and M2 being turned on where BL0 is to output a logic 1 and BLB1 is to output a logic 0, the voltage at node INP remains at VDD, while the voltage at node INN falls, with the difference between the two being Vdiff.

However, operation of the prior SRAM memory circuit 50 is not necessarily ideal. Although transistors M3 and M4 are turned off, there is a parasitic capacitance CP1 between the source of transistor M4 and node INP. As can be seen in FIG. 1B, since cell 53 store "0" value so BL1 discharges and due the parasitic capacitance CP1 between BL1 and INP node, node INP does not remain at VDD, but discharges which results in loss of effective Vdiff. The discharge current on BL1 through MEMCELL2 discharges INP due to the CP1 parasitic capacitor. Thus, the difference Vdiff between the voltages at INP and INN reduces by ΔV. This may cause an error when the bit lines BL0 and BLB0 are read.

This is an undesirable situation. Therefore, further development in the area of SRAM memory circuits is needed.

SUMMARY

Disclosed herein is an electronic device including a first column configured to be selectable by a first control signal, and a second column selectable by second control signal. The second column includes a second memory cell and a second bit line associated with the second memory cell. A first transistor has a first conduction terminal coupled to the second bit line, a second conduction terminal coupled to a bit line node, and a control terminal biased by a second control signal. A second transistor has a first conduction terminal coupled to the second complementary bit line, a second conduction terminal coupled to a complementary bit line node, and a control terminal biased by the second control signal. A first replica transistor that is a replica of the first transistor has a first conduction terminal coupled to the second bit line, a second conduction terminal coupled to the complementary bit line node, and a control terminal biased such that the first replica transistor is always off or at least when the second control signal selects the second column. A second replica transistor is a replica of the second transistor and has a first conduction terminal coupled to the second complementary bit line, a second conduction terminal coupled to the bit line node, and a control terminal biased such that the second replica transistor is always off or at least when the second control signal selects the second column.

The control terminals of the first and second replica transistors may be biased such that the first and second replica transistors are always off.

The first column may include a first memory cell, a first bit line associated with the first memory cell, and a first complementary bit line associated with the first memory cell. A third transistor may have a first conduction terminal coupled to the first bit line, a second conduction terminal coupled to the bit line node, and a control terminal biased by the first control signal. A fourth transistor may have a first conduction terminal coupled to the first complementary bit line, a second conduction terminal coupled to the complementary bit line node, and a control terminal biased by the first control signal.

A third replica transistor that is a replica of the third transistor may have a first conduction terminal coupled to the first bit line, a second conduction terminal coupled to the complementary bit line node, and a control terminal biased such that the third replica transistor is off at least when the first control signal selects the first column. A fourth replica transistor that is a replica of the fourth transistor may have a first conduction terminal coupled to the first complementary bit line, a second conduction terminal coupled to the bit line node, and a control terminal biased such that the fourth replica transistor is off at least when the first control signal selects the first column.

The control terminals of the third and fourth replica transistors may be biased such that the first and second replica transistors are always off.

DETAILED DESCRIPTION

Figure 1A:
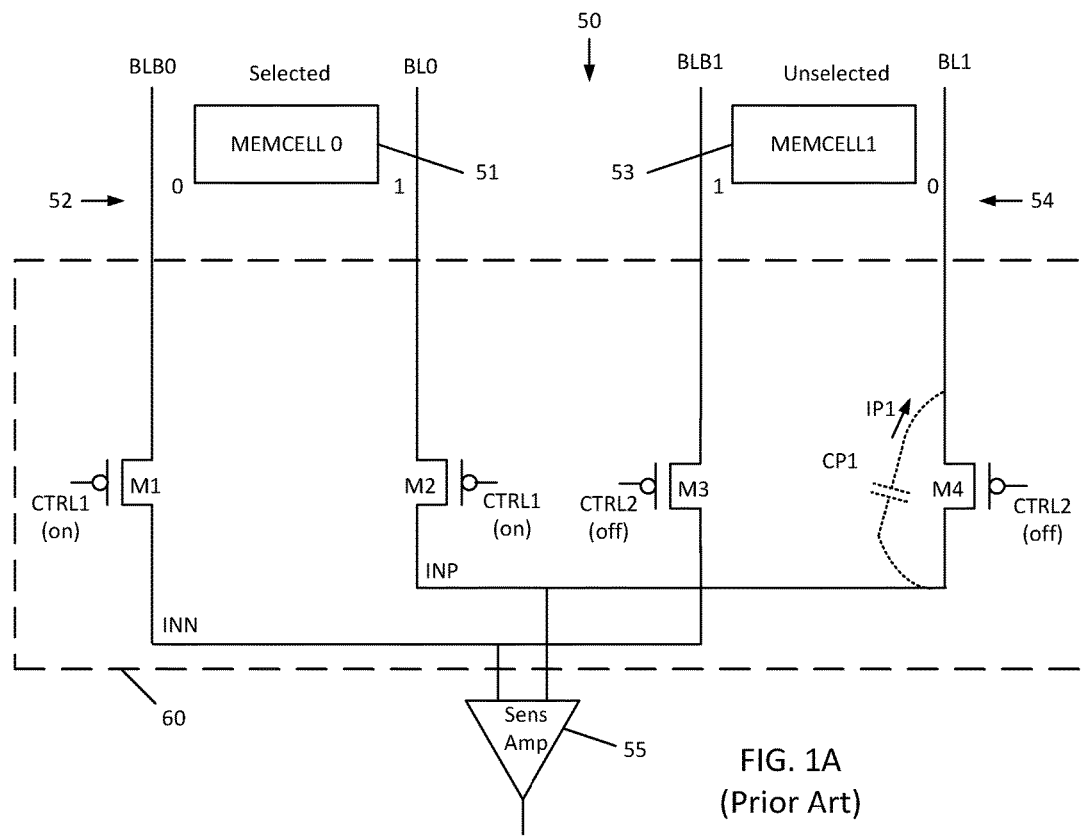
FIG. 1A is a schematic block diagram of a prior art SRAM memory device.
Figure 1B:
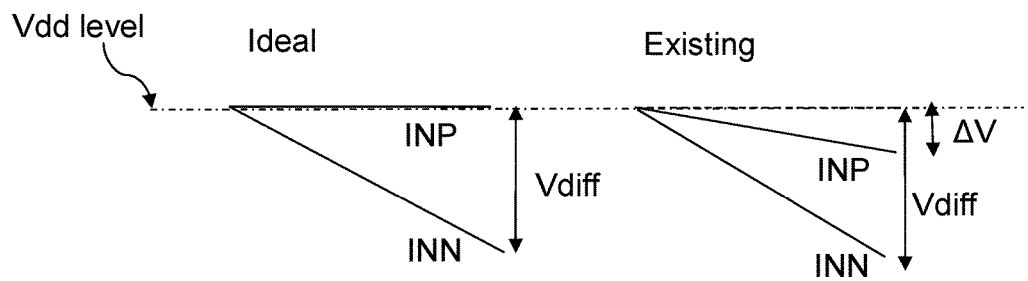
FIG. 1B is a graph showing ideal and actual operating voltages of the bit line and complementary bit line nodes of FIG. 1A.

The drawing figures and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only. As described herein, a "replica" transistor has a same length and width as the transistor it replicates, or has substantially similar or substantially identical electrical properties as the transistor it replicates.

Figure 2A:
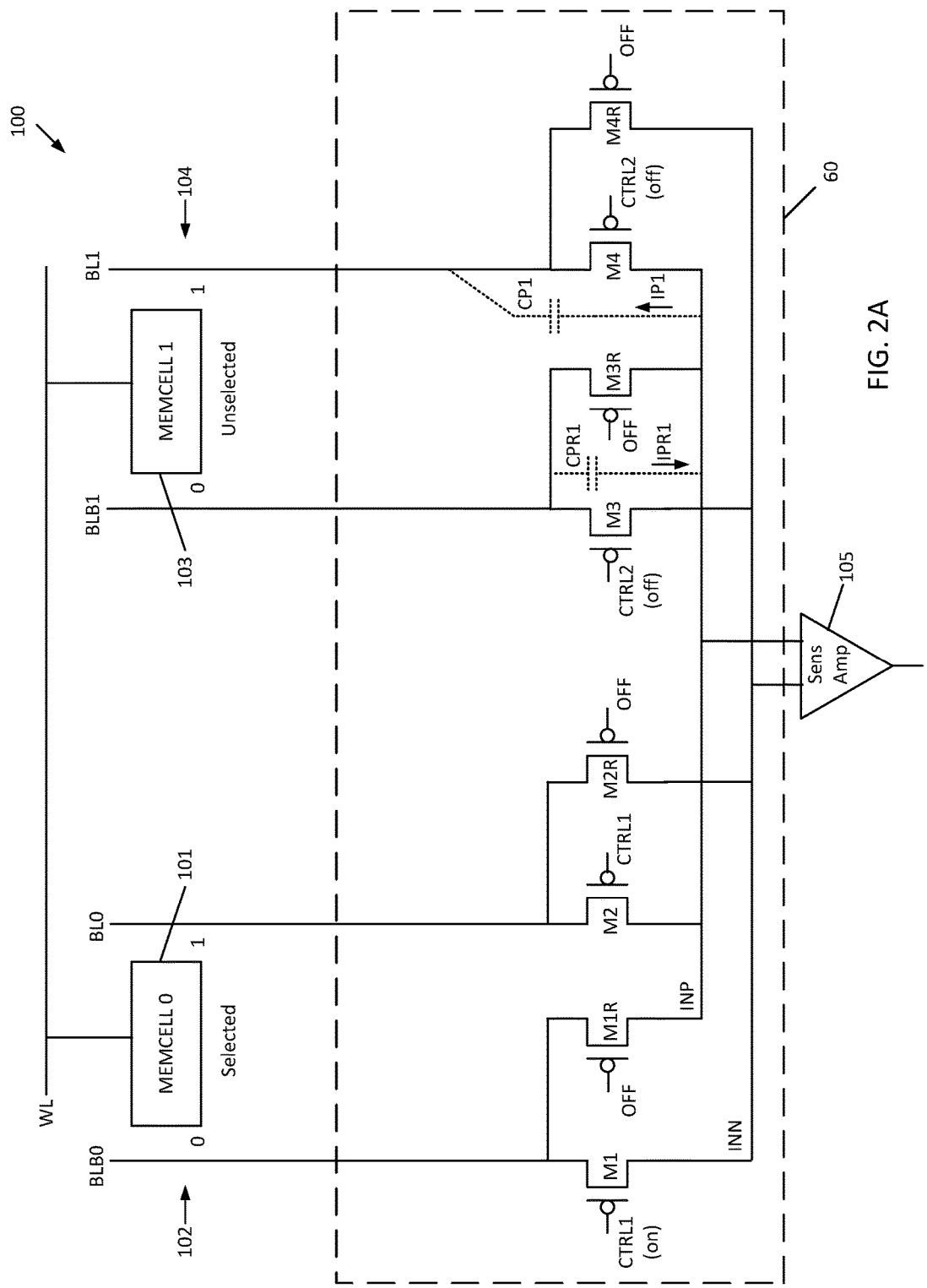
FIG. 2A is a schematic block diagram of an SRAM memory device in accordance with this disclosure in which the first column is selected, and in which the first bit line is intended to output a logic 1.

An SRAM memory circuit 100 is now described with reference to FIG. 2A. The SRAM memory circuit 100 includes first and second columns 102 and 104. The first column 102 includes memory cell 101 with a bitline BL0 and a complementary bitline BLB0 associated therewith. The column selection circuit 160 includes a PMOS transistor M1 with its source coupled to complementary bitline BLB0, its drain coupled to node INN, and its gate biased by control signal CTRL1. PMOS transistor M2 has its source coupled to bitline BL0, its drain coupled to node INP, and its gate biased by control signal CTRL1.

PMOS transistor M1R is a replica of transistor M1, has its source coupled to the source of transistor M1, its drain coupled to node INP, and its gate biased such that the PMOS transistor M1R is always off. PMOS transistor M2R is a replica of transistor M2, has its source coupled to the source of transistor M2, its drain coupled to node INN, and its gate biased such that the PMOS transistor M2R is always off.

The second column 104 includes memory cell 103 with bitline BL1 and complementary bitline BLB1 associated therewith. The column selection circuit 160 includes PMOS transistor M3 with its source coupled to complementary bitline BLB1, it drain coupled to node INN, and its gate biased by control signal CTRL2. PMOS transistor M4 has its source coupled to bitline BL1, its drain coupled to node INP, and its gate biased by control signal CTRL2.

PMOS transistor M3R is a replica of transistor M3, has its source coupled to the source of transistor M3, its drain coupled to node INP, and its gate biased such that the PMOS transistor M3R is always off. PMOS transistor M4R is a replica of transistor M4, has its source coupled to the source of transistor M4, its drain coupled to node INN, and its gate biased such that the PMOS transistor M4R is always off.

Nodes INN and INP serve as the outputs of the column selection circuit 160 and the inputs to sense amplifier 105. In operation, one column 102 or 104 is selected while the other column 102 or 104 is unselected. In the example operation state shown in FIG. 2A, column 102 is selected while column 104 is deselected and bitline BL0 is intended to output a logic 1 while complementary bitline BLB0 is intended to output a logic 0. This is accomplished by control signal CTRL1 going low to turn on bitline select transistors M1 and M2, while control signal CTRL2 goes high to turn off bitline select transistors M3 and M4.

Memory cells 101 and 103 can take either a "0" and "1" state based on the data stored in the memory. For example, if memory cell 101 stores a "0", and it is selected for a read operation, then bitline BL0 will discharge towards ground and complementary bitline BLB0 will remain at VDD. Similarly, if memory cell 101 were to store "1", BLB0 will discharge and BL0 will remain at VDD. The same operation applies with memory cell 103, where if memory cell 103 stores "0" and is selected for read, then bitline BL1 will discharge towards ground and complementary bitline BLB1 will remain at VDD. Similarly, if memory cell 103 stores "1", BLB1 will discharge and BL1 will remain at VDD With reference to FIG. 2A, consider the case when memory cells 101 and 103 store the same value "0" or "1", and whichever column is selected among 102 and 104, Vdiff (the difference between the voltage at INP and INN) does not reduce. This can be explained by considering that if memory cells 101 and 103 both store the same value "0" and memory cell 102 is selected for read by control signal CTRL1, then BL1 and BL0 both will discharge. BL1 and BL0 both are connected to node INP by transistors M4 and M2 respectively, since M4 is turned off by control signal CTRL2, due to parasitic capacitance CP1 between BL1 and INP, discharge of BL1 helps BL0 to discharge more and hence increases Vdiff. This is also the case where memory cells 101 and 103 both store a same value "1".

Figure 3A:
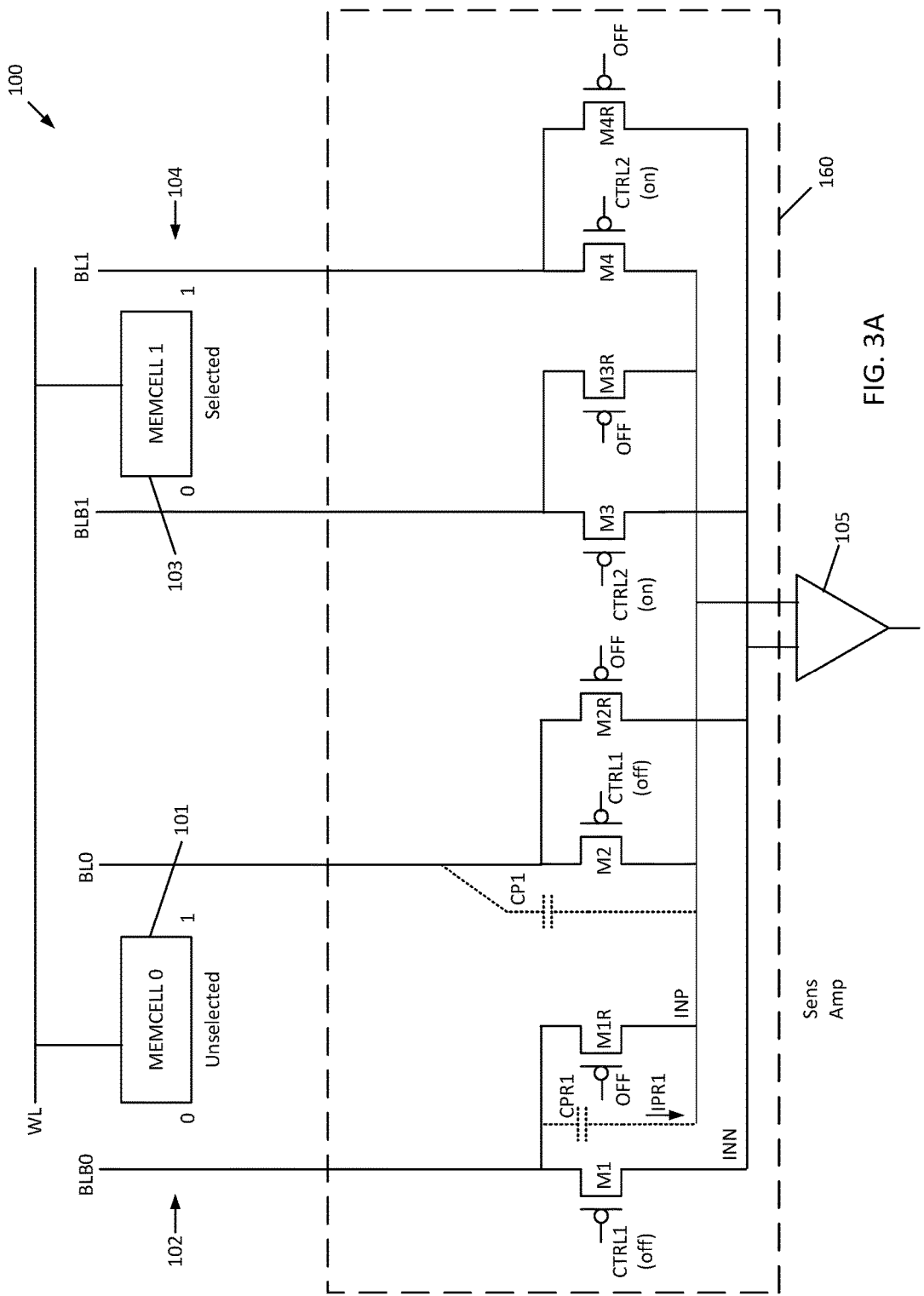
FIG. 3A is a schematic block diagram of an SRAM memory device in accordance with this disclosure in which the second column is selected, and in which the second bit line is intended to output a logic 1.

With reference to FIG. 3A, also consider the case when memory cells 101 and 103 store the same value "0" or "1", and whichever column is selected among 102 and 104, Vdiff (the difference between the voltage at INP and INN) does not reduce. This can be explained by considering that if memory cells 101 and 103 both store the same value "0" and memory cell 103 is selected for read by control signal CTRL2, then BL1 and BL0 both will discharge. BL1 and BL0 both are connected to node INP by transistors M4 and M2 respectively, since M2 is turned off by control signal CTRL1; due to parasitic capacitance CP1 between BL0 and INP, discharge of BL0 helps BL1 to discharge more and hence increases Vdiff. This is also the case where memory cells 101 and 103 both store a same value "1".

Figure 2B:
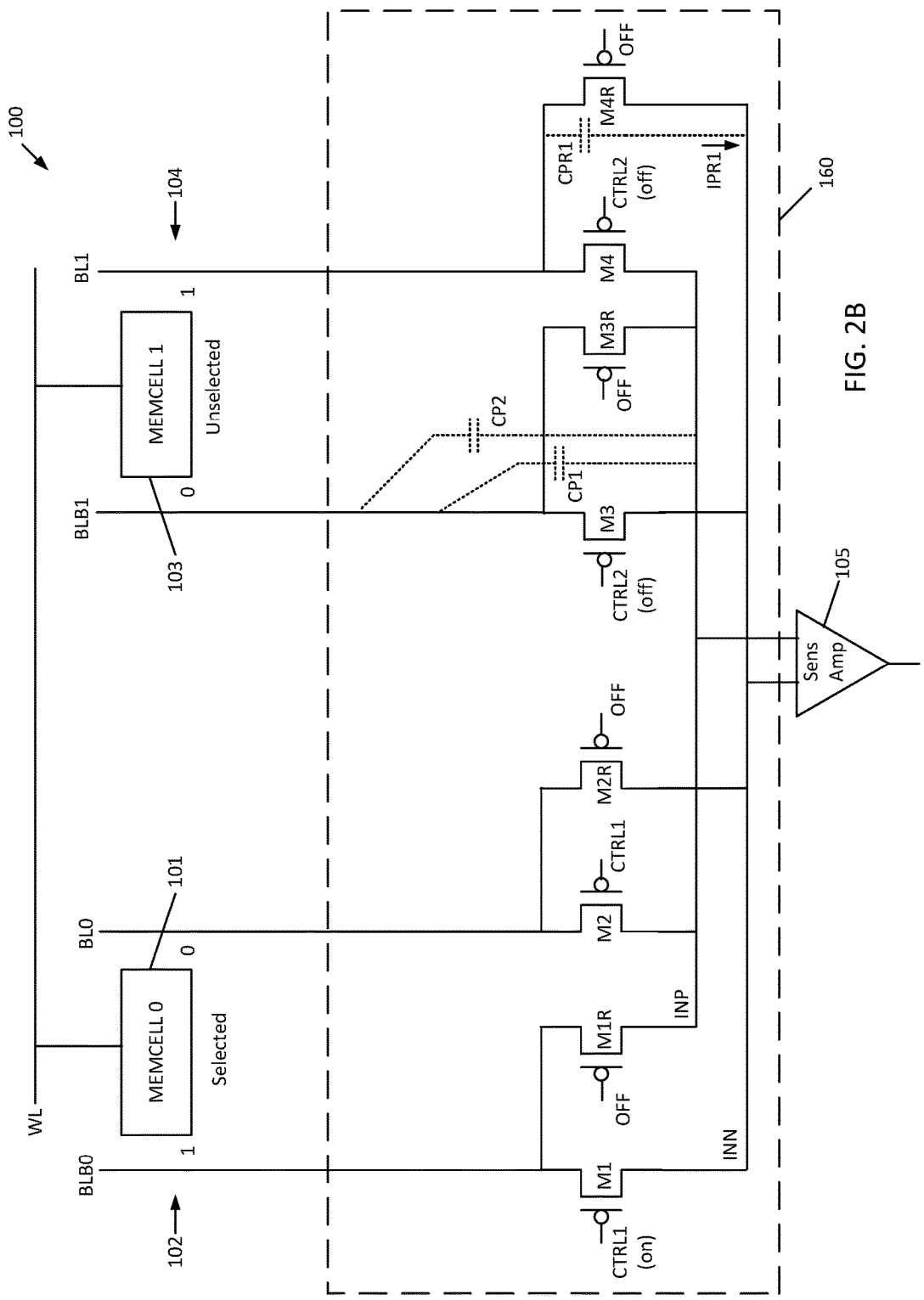
FIG. 2B is a schematic block diagram of an SRAM memory device in accordance with this disclosure in which the first column is selected, and in which the first bit line is intended to output a logic 0.

Thus, Vdiff loss occurs when memory cells 101 and 103 store opposite values (such as the case shown in FIG. 2B).

In the proposed circuit, the Vdiff loss is compensated by adding replica transistor M1R and M2R in column 102 and M3R and M4R in column 104. In FIG. 2B, the compensation of loss in Vdiff can be explained by considering the case when cell 101 storeS "0" and cell 103 storeS "1". Column 102 is selected by control signal CTRL1, BL0 discharges towards ground level so the nodes INP, INN are supposed to remain at VDD because BLB0 does not discharge and remains at VDD. However, due to parasitic capacitance CP1 between INN and BLB1, INN also discharges towards ground level due to coupling because BLB1 discharges. This coupling is compensated by the replica transistor M3R. M3R is in OFF state and it provides the same parasitic capacitance CP2 between BLB1 and INP as M3 introduces between BLB1 and INN. Thus, node INP discharge towards the ground level due to the parasitic capacitance of replica transistor M3R by the same amount as INN discharge towards ground level due to the parasitic capacitance of transistor M3.

Figure 3B:
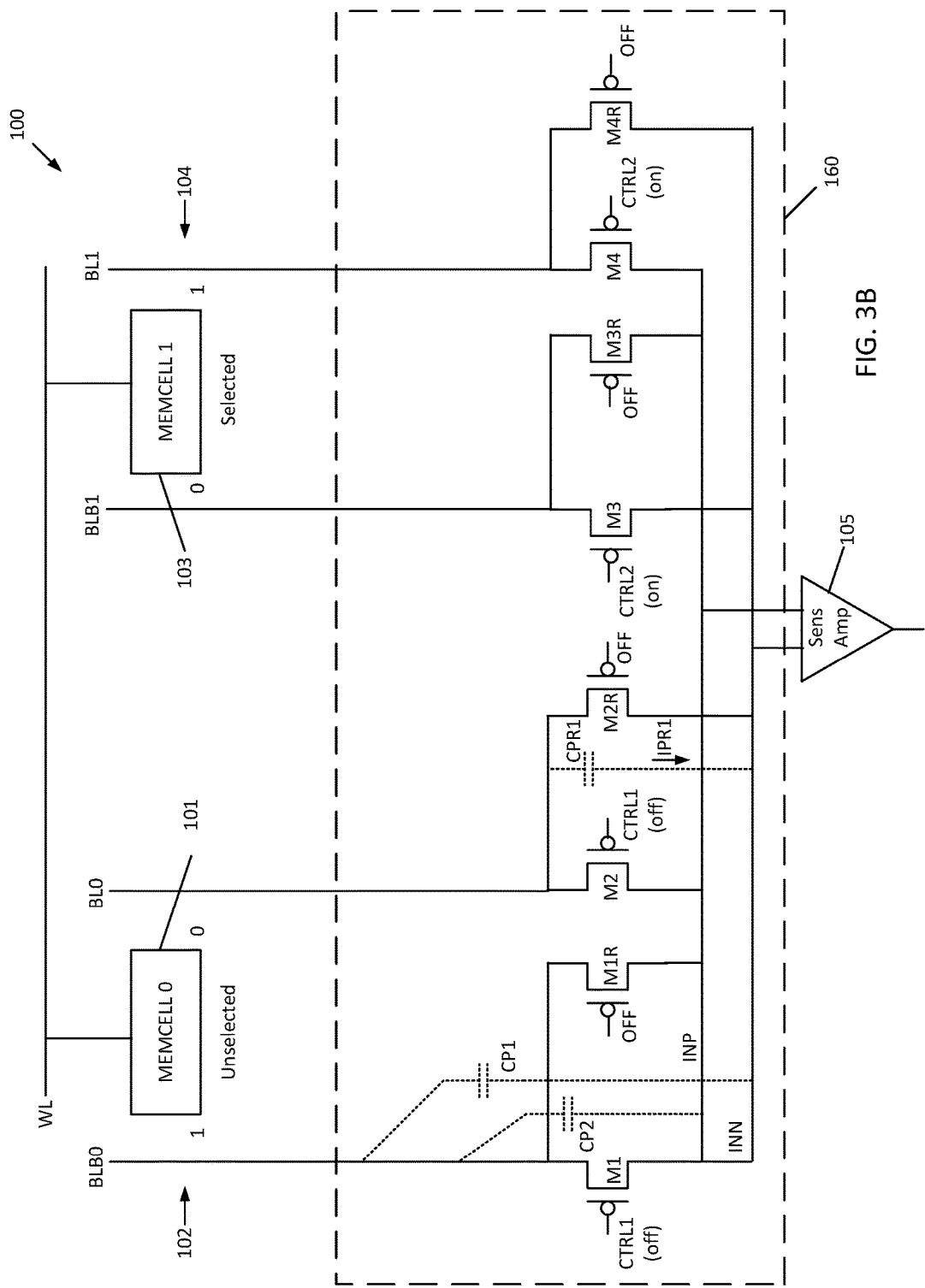
FIG. 3B is a schematic block diagram of an SRAM memory device in accordance with this disclosure in which the second column is selected, and in which the second bit line is intended to output a logic 0.

Similarly, in FIG. 3B, column 104 is selected by control signal CTRL2, BL1 discharges towards ground level so the nodes INP, INN are supposed to remain at VDD because BLB1 does not discharge and remains at VDD. However, due to parasitic capacitance CP1 between INN and BLB0, INN also discharges towards ground level due to coupling because BLB0 discharges. This coupling is compensated by the replica transistor M1R. M1R is in OFF state and it provides the same parasitic capacitance CP2 between BLB0 and INP as M1 introduces between BLB0 and INN. Thus, node INP discharge towards the ground level due to the parasitic capacitance of replica transistor M1R by the same amount as INN discharge towards ground level due to the parasitic capacitance of transistor M1.

In addition to the above, the transistors M1-M4 and M1R-M4R may be reduced in size compared to conventional SRAM circuits, for example being 50% of the usual size.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

The invention claimed is:

1. An electronic device, comprising:
a first column configured to be selectable by a first control signal;
a second column comprising:
 a second memory cell;
 a second bit line associated with the second memory cell;
 a first transistor having a first conduction terminal coupled to the second bit line, a second conduction terminal coupled to a bit line node, and a control terminal biased by a second control signal; and
 a second transistor having a first conduction terminal coupled to second complementary bit line, a second conduction terminal coupled to a complementary bit line node, and a control terminal biased by the second control signal;
 a first replica transistor that is a replica of the first transistor and having a first conduction terminal coupled to the second bit line, a second conduction terminal coupled to the complementary bit line node, and a control terminal biased such that the first replica transistor is off at least when the second control signal selects the second column; and
 a second replica transistor that is a replica of the second transistor and having a first conduction terminal coupled to the second complementary bit line, a second conduction terminal coupled to the bit line node, and a control terminal biased such that the second replica transistor is off at least when the second control signal selects the second column.

2. The electronic device of claim 1, wherein the control terminals of the first and second replica transistors are biased such that the first and second replica transistors are always off.

3. The electronic device of claim 1, wherein the first column comprises:
a first memory cell;
a first bit line associated with the first memory cell;
a first complementary bit line associated with the first memory cell;
and further comprising:
 a third transistor having a first conduction terminal coupled to the first bit line, a second conduction terminal coupled to the bit line node, and a control terminal biased by the first control signal; and
 a fourth transistor having a first conduction terminal coupled to the first complementary bit line, a second conduction terminal coupled to the complementary bit line node, and a control terminal biased by the first control signal.

4. The electronic device of claim 3, further comprising:
a third replica transistor that is a replica of the third transistor and having a first conduction terminal coupled to the first bit line, a second conduction terminal coupled to the complementary bit line node, and a control terminal biased such that the third replica transistor is off at least when the first control signal selects the first column; and
a fourth replica transistor that is a replica of the fourth transistor and having a first conduction terminal coupled to the first complementary bit line, a second conduction terminal coupled to the bit line node, and a control terminal biased such that the fourth replica transistor is off at least when the first control signal selects the first column.

5. The electronic device of claim 4, wherein the control terminals of the third and fourth replica transistors are biased such that the first and second replica transistors are always off.

6. An electronic device, comprising:
a first column comprising:
 a first memory cell;
 a first bit line associated with the first memory cell;
 a first complementary bit line associated with the first memory cell;
first column select circuitry comprising:
 a first bit line select transistor selectively coupling the first bit line to a bit line node in response to a first control signal;
 a first complementary bit line select transistor selectively coupling the first complementary bit line to a complementary bit line node in response to the first control signal;
a second column comprising:
 a second memory cell;
 a second bit line associated with the second memory cell;
 a second complementary bit line associated with the second memory cell;
second column select circuitry comprising:
 a second bit line select transistor selectively coupling the second bit line to the bit line node in response to a second control signal;
 a second complementary bit line select transistor selectively coupling the second complementary bit line to the complementary bit line node in response to the second control signal;
wherein parasitic capacitances are between the bit line node and components of the second column selection circuitry, and between the complementary bit line node and components of the second column selection circuitry, when the first control signal selects the first column and the second control signal deselects the second column;
wherein currents flow through the parasitic capacitances when the first control signal selects the first column and the second control signal deselects the second column;
wherein the second column selection circuitry has replica components comprising:
a second bit line replica transistor that is a replica of the second bit line transistor and coupled between the second bit line and the bit line node;
a second complementary bit line replica transistor that is a replica of the second complementary bit line transistor and coupled between the second complementary bit line and the complementary bit line node;
wherein a compensating parasitic capacitance is between the bit line node and the replica components of the second column selection circuitry, when the first control signal selects the first column and the second control signal deselects the second column;
wherein a compensating current flows through the compensating parasitic capacitance between the bit line node and the replica components of the second column selection circuitry, when the first control signal selects the first column and the second control signal deselects the second column.

7. The electronic device of claim 6, wherein the first column selection has replica components comprising:
a first bit line replica transistor that is a replica of the first bit line transistor and coupled between the first bit line and the bit line node; and
a first complementary bit line replica transistor that is a replica of the first complementary bit line transistor and coupled between the first complementary bit line and the complementary bit line node.

8. The electronic device of claim 7,
wherein parasitic capacitances form between the bit line node and components of the first column selection circuitry, and between the complementary bit line node and components of the first column selection circuitry, when the second control signal selects the second column and the first control signal deselects the first column; and
wherein currents flow through the parasitic capacitances when the second control signal selects the second column and the first control signal deselects the first column.

9. The electronic device of claim 8,
wherein a compensating parasitic capacitance forms between the bit line node and the replica components of the first column selection circuitry, when the second control signal selects the second column and the first control signal deselects the first column; and
wherein a compensating current flows through the compensating parasitic capacitance between the bit line node and the replica components of the first column selection circuitry, when the second control signal selects the second column and the first control signal deselects the first column.

10. A method, comprising:
selecting a first memory column and deselecting a second memory column, wherein a bit line of the first memory column is intended to output a logic one while a complementary bit line of the first memory column is intended to output a logic zero, and in response to the selection:
forming parasitic capacitances between a bit line node of the first memory column and components of second memory column selection circuitry and between a complementary bit line node of the first memory column and components of the second memory column selection circuitry;
conducting currents through the parasitic capacitances, thereby undesirably lowering a voltage at the bit line node;
forming a compensating parasitic capacitance between the bit line node and replica components in the second column; and
conducting a compensating current through the parasitic capacitance, thereby compensating the voltage at the bit line node for the currents conducted through the parasitic capacitance.

11. The method of claim 10, further comprising selecting the first memory column and deselecting the second memory column, wherein the bit line of the first memory column is intended to output a logic zero while the complementary bit line of the first memory column is intended to output a logic one, and in response to the selection:
forming parasitic capacitances between a complementary bit line node of the first memory column and components of the second memory column selection circuitry and between a bit line node of the first memory column and components of the second memory column selection circuitry;
conducting currents through the parasitic capacitances, thereby undesirably lowering a voltage at the complementary bit line node;
forming a compensating parasitic capacitance between the complementary bit line node and replica components in the second column selection circuitry; and
conducting a compensating current through the parasitic capacitance, thereby compensating the voltage at the complementary bit line node for the currents conducted through the parasitic capacitance.

12. The method of claim 10, further comprising:
selecting the second memory column and deselecting the first memory column, wherein a bit line of the second memory column is intended to output a logic one while a complementary bit line of the second memory column is intended to output a logic zero, and in response to the selection;
forming parasitic capacitances between the bit line node and components of first memory column selection circuitry and between the complementary bit line node and components of the first memory column selection circuitry;
conducting currents through the parasitic capacitances, thereby undesirably lowering a voltage at the bit line node;
forming a compensating parasitic capacitance between the bit line node and replica components in the first column; and
conducting a compensating current through the parasitic capacitance, thereby compensating the voltage at the bit line node for the currents conducted through the parasitic capacitance.

13. The method of claim 10, further comprising:
selecting the second memory column and deselecting the first memory column, wherein a bit line of the second memory column is intended to output a logic zero while a complementary bit line of the second memory column is intended to output a logic one, and in response to the selection;

forming parasitic capacitances between the complementary bit line node and components of the first memory column selection circuitry and between the bit line node and components of the first memory column selection circuitry;

conducting currents through the parasitic capacitances, thereby undesirably lowering a voltage at the complementary bit line node;

forming a compensating parasitic capacitance between the complementary bit line node and replica components in the first column selection circuitry; and conducting a compensating current through the parasitic capacitance, thereby compensating the voltage at the complementary bit line node for the currents conducted through the parasitic capacitance.

14. A method, comprising:

selecting a first memory column by turning on bit line and complementary bit line select transistors of the first memory column, and deselecting a second memory column by turning off bit line and complementary bit line select transistors of the second memory column, wherein a bit line of the first memory column is intended to output a logic one while a complementary bit line of the first memory column is intended to output a logic zero, and in response to the selection:

forming parasitic capacitances between a bit line node of the first memory column and components of the second memory column and between a complementary bit line node of the first memory column and components of the second memory column;

conducting currents through the parasitic capacitances, thereby undesirably lowering a voltage at the bit line node;

forming a compensating parasitic capacitance through which a compensating current flows to compensate the voltage at the bit line node for the currents conducted through the parasitic capacitance by coupling a replica of the complementary bit line select transistor of the second memory column between a complementary bit line of the second memory column and the bit line node; and conducting a compensating current through the parasitic capacitance, thereby compensating the voltage at the bit line node for the currents conducted through the parasitic capacitance.

15. The method of claim 14, further comprising:

selecting a first memory column by turning on bit line and complementary bit line select transistors of the first memory column, and deselecting a second memory column by turning off bit line and complementary bit line select transistors of the second memory column, wherein a bit line of the first memory column is intended to output a logic zero while a complementary bit line of the first memory column is intended to output a logic one, and in response to the selection:

forming parasitic capacitances between a complementary bit line node of the first memory column and components of the second memory column and between a bit line node of the first memory column and components of the second memory column;

conducting currents through the parasitic capacitances, thereby undesirably lowering a voltage at the complementary bit line node;

forming a compensating parasitic capacitance through which a compensating current flows to compensate the voltage at the complementary bit line node for the currents conducted through the parasitic capacitance by coupling a replica of the bit line select transistor of the second memory column between a complementary bit line of the second memory column and the bit line node; and conducting a compensating current through the parasitic capacitance, thereby compensating the voltage at the complementary bit line node for the currents conducted through the parasitic capacitance.

16. The method of claim 14, further comprising:

selecting a second memory column by turning on bit line and complementary bit line select transistors of the second memory column, and deselecting a first memory column by turning off bit line and complementary bit line select transistors of the first memory column, wherein a bit line of the second memory column is intended to output a logic one while a complementary bit line of the second memory column is intended to output a logic zero, and in response to the selection:

forming parasitic capacitances between a bit line node of the second memory column and components of the first memory column and between a complementary bit line node of the second memory column and components of the first memory column;

conducting currents through the parasitic capacitances, thereby undesirably lowering a voltage at the bit line node;

forming a compensating parasitic capacitance through which a compensating current flows to compensate the voltage at the bit line node for the currents conducted through the parasitic capacitance by coupling a replica of the complementary bit line select transistor of the first memory column between a complementary bit line of the first memory column and the bit line node; and conducting a compensating current through the parasitic capacitance, thereby compensating the voltage at the bit line node for the currents conducted through the parasitic capacitance.

17. The method of claim 14, further comprising:

selecting a second memory column by turning on bit line and complementary bit line select transistors of the second memory column, and deselecting a first memory column by turning off bit line and complementary bit line select transistors of the first memory column, wherein a bit line of the second memory column is intended to output a logic zero while a complementary bit line of the second memory column is intended to output a logic one, and in response to the selection:

forming parasitic capacitances between a complementary bit line node of the second memory column and components of the first memory column and between a bit line node of the second memory column and components of the first memory column;

conducting currents through the parasitic capacitances, thereby undesirably lowering a voltage at the complementary bit line node;

forming a compensating parasitic capacitance through which a compensating current flows to compensate the voltage at the complementary bit line node for the currents conducted through the parasitic capacitance by coupling a replica of the bit line select transistor of the first memory column between a bit line of the first memory column and the bit line node; and conducting a compensating current through the parasitic capacitance, thereby compensating the voltage at the complementary bit line node for the currents conducted through the parasitic capacitance.

* * * * *